United States Patent
Michel et al.

(10) Patent No.: US 6,591,383 B1
(45) Date of Patent: Jul. 8, 2003

(54) BIT ERROR RATE DETECTION

(75) Inventors: David Michel, Kfar Sava (IL); Amir Dabby, Holon (IL); Hanoch Levy, Tel Aviv (IL)

(73) Assignee: ECI Telecom Ltd., Petach Tikva (IL)

( * ) Notice: Subject to any disclaimer, the term of this patent is extended or adjusted under 35 U.S.C. 154(b) by 0 days.

(21) Appl. No.: 09/443,384

(22) Filed: Nov. 19, 1999

(51) Int. Cl.[7] .......................... H04L 1/00; H03M 13/00
(52) U.S. Cl. ........................... 714/704; 714/802
(58) Field of Search ................. 714/704–708

(56) References Cited

U.S. PATENT DOCUMENTS 5,724,362 A * 3/1998 Lau ........................ 714/704
5,764,651 A * 6/1998 Bullock et al. ............ 714/708

FOREIGN PATENT DOCUMENTS

EP    0 862 292       9/1998
JP    08139706 A  *  5/1996  ............. H04L/1/00

* cited by examiner

Primary Examiner—R. Stephen Dildine
(74) Attorney, Agent, or Firm—Browdy and Neimark, P.L.L.C.

(57) ABSTRACT

A method and apparatus for detecting an error rate of a data stream. The data stream is divided into a sequence of blocks, and a detection interval is defined including a predetermined number of blocks in the sequence. For one or more of the blocks in the detection interval, respective error measures are computed responsive to the error rate of the data stream. The one or more blocks in the detection interval are classified as good or bad blocks by comparing the respective error measures to a first threshold. It is estimated that an error condition exists in the data stream by comparing a count of the bad blocks in the interval to a second threshold.

31 Claims, 5 Drawing Sheets

BIT ERROR RATE DETECTION

FIELD OF THE INVENTION

The present invention relates generally to high-speed digital communications, and specifically to SONET/SDH communication networks.

BACKGROUND OF THE INVENTION

SONET (Synchronous Optical Network) and SDH (Synchronous Digital Hierarchy) are two families of closely-related and mutually-compatible standards for high-speed data communication. These standards govern interface parameters; rates, formats and multiplexing methods; and operations, administration, maintenance and provisioning for high-speed signal transmission. SONET and SDH use frame formats for transmitting data. SDH/SONET requires that errors in transmission be detected and an alarm condition be set when a bit error rate in a data stream exceeds a specified level. The bit error rate (BER) is defined as the number of erred bits in a frame divided by the total number of bits in the frame. Typically, the BER alarm is an indication that a fiber channel over which the transmission is being conveyed has degraded, and the transmission is then switched to a different, undegraded channel.

The maximum permitted BER is a function of line type. Typically a defect condition is detected when the BER exceeds $10^{-3}$. A hysteresis is introduced in clearing the defect condition, so that typically only when the BER drops back below $10^{-4}$ is the defect condition cleared. According to requirements set by the International Telecommunications Union (ITU) in standard G.783, detection and clearing of the defect state must take place within a specified detection time. Other requirement levels have different BER limits, such as $10^{-4}$ or $10^{-5}$, and different detection times.

SDH/SONET data frames include bytes set aside for error detection using bit interleaved parity (BIP) checks. For each frame, the BIP is calculated before transmission and is then transmitted with the next frame. At the receiving end, the BIP is recalculated and compared with the transmitted BIP value in the next frame. A discrepancy between recalculated and transmitted BIPs is noted as a BIP error. It is intuitively clear that the number of BIP errors in a given time period is a function of the current BER, and therefore BIP error detection is used for the purpose of BER defect detection and clearing. The relation between BIP errors and BER is probabilistic, so that a certain amount of uncertainty is inevitable in using BIP errors to track BER defects. The ITU requires that when $BER \geq 10^{-3}$, BIP processing (or any other estimation method that is used) detect the defect condition within the permitted detection time (40 ms in one specific case) with a detection probability of $\geq 0.99$, whereas when $BER \leq 10^{-4}$, the false alarm probability, i.e., the chance of incorrectly reporting a detected defect condition, should be $\leq 10^{-6}$. By the same token, when $BER \leq 10^{-4}$, the probability of clearing an existing defect condition should be $\geq 0.99$, whereas the probability of clearing while $BER \geq 10^{-3}$ should be $\leq 10^{-6}$. The required calculations must be performed at high speed and impose a heavy load on the hardware and software responsible for BER defect detection.

A number of methods have been proposed to reduce the hardware and software resources required for BER detection. For example, U.S. Pat. No. 5,764,651, whose disclosure is incorporated herein by reference, describes a system for finding an error rate in a data stream using a variable length window to sample erred bits in the data stream. If the measured error rate, based on BIP calculation, is greater than an allowable threshold, the window length is reduced. When the window length reaches zero, a defect condition is detected.

European Patent Application EP 862,292, whose disclosure is incorporated herein by reference, describes a method for BER detection using two or more BIP monitors with respective fixed window lengths. Each of the monitors detects the presence or absence of a particular BER, for example, $10^{-6}$ and $10^{-7}$, respectively, by integrating BIP errors over time. A monitor client reacts to notifications from the BER monitors so as to determine that the BER state of the data stream has changed and to generate an alarm when appropriate.

SUMMARY OF THE INVENTION

It is an object of the present invention to provide improved methods and apparatus for monitoring the BER of a data stream.

In some aspects of the present invention, the methods and apparatus are applied to a SDH/SONET data stream so as to detect and clear BER defect states in accordance with accepted communications standards.

It is a further object of some aspects of the present invention to provide reliable and flexible methods and devices for detecting and clearing BER defect states based on BIP error detection.

In preferred embodiments of the present invention, an error detection method for detection of BER conditions in a SDH/SONET data stream comprises first and second processing stages. In the first stage, data blocks of given size are successively processed to determine a measure of bit errors in each block, preferably based on the number of BIP errors in the block. If the error measure in a given block exceeds a first predetermined threshold, the block is noted as an error block. In the second stage, the error results are stored, preferably in a shift register, for an interval of time containing a selected number of successive blocks. The shift register thus defines a "rolling window" in time. If the number of error blocks within the interval exceeds a second threshold, then a BER defect condition is detected. The size of the data blocks, the duration of the window, and the first and second thresholds are chosen based on the statistical relationship of the number of BIP errors to the BER of the data stream, so that the actual BER condition is detected within the time permitted and with the levels of confidence (i.e., high detection rate and low false alarm rate) dictated by applicable standards.

Once the BER defect condition is detected, one or more of the detection parameters, preferably including the second threshold, are readjusted. The new second threshold represents a maximum number of error blocks in the rolling window for which the error condition will be maintained. When the number of error blocks in the window drops below this threshold, the BER condition is cleared. Optionally, other parameters, such as the block size, window length and first threshold, may also be changed when seeking to clear the BER defect condition. Maintaining these other parameters at the same values for both the defect detection and defect clearing phases of operation is generally advantageous, however, since it simplifies the hardware and software design of the device.

Preferably, for the sake of computational simplicity and speed, the errors are determined with respect to a BIP2 calculation, comprising a 2-bit result in which one bit is the XOR of all of the even bits in a given data frame, and the other bit is the XOR of all of the odd bits. Alternatively, however, any other type of BIP calculation, such as BIP8 (yielding an eight-bit result) or error detection calculations of other types, may be used.

There is therefore provided, in accordance with a preferred embodiment of the present invention, a method for detecting an error rate of a data stream, including:

dividing the data stream into a sequence of blocks;

defining a detection interval including a predetermined number of blocks in the sequence;

computing for one or more of the blocks in the detection interval respective error measures responsive to the error rate of the data stream;

classifying the one or more blocks in the detection interval as good or bad blocks by comparing the respective error measures to a first threshold; and estimating that an error condition exists in the data stream by comparing a count of the bad blocks in the interval to a second threshold.

Preferably, computing the error measures includes computing bit interleave parity (BIP) values and comparing the computed BIP values to reference BIP values transmitted with the data stream to find BIP errors. Further preferably, each of the blocks includes a predetermined number of data frames, and computing and comparing the BIP values includes computing BIP values with respect to the frames. Most preferably, the BIP values include BIP2 values.

Preferably, computing the BIP values includes counting how many BIP errors occur in a given one of the blocks. Most preferably, the first threshold defines a number of BIP errors that may occur in the block, such that classifying the one or more blocks includes counting a block as bad if the number of BIP errors in the block is greater than or equal to the defined number. Further preferably, estimating that the error condition exists includes estimating that the error rate of the data stream exceeds a permitted bit error rate (BER) and setting a BER output responsive to the estimation.

Preferably, the data stream is conveyed over a SDH/SONET network element.

Preferably, estimating that the error condition exists includes determining that there is a detection probability greater than a minimum detection probability that the error rate of the data stream exceeds a predetermined error level. Further preferably, estimating that the error condition exists includes determining that there is a false alarm probability less than a maximum false alarm probability that the error rate of the data stream is less than a predetermined clear level. Most preferably, the first and second thresholds are chosen responsive to the minimum detection probability and maximum false alarm probability. In a preferred embodiment, dividing the data stream into blocks includes selecting a block size responsive to the minimum detection probability and maximum false alarm probability, and wherein the first and second thresholds are chosen responsive to the block size.

Preferably, defining the detection interval includes defining an interval that is no greater than a maximum detection time permitted for estimating that the error condition exists when the error rate of the data stream exceeds a predetermined error level.

In a preferred embodiment, defining the detection interval includes defining a sliding window, such that periodically a new block in the sequence is added to the interval, and the earliest block in the sequence that is contained in the interval is removed therefrom. Preferably, estimating that the error condition exists includes estimating that an error condition exists if all of the blocks in the interval have error measures greater than or equal to the first threshold.

In a further preferred embodiment, the method includes:

defining a clear interval including a predetermined number of blocks in the sequence;

computing the respective error measures for the blocks in the clear interval;

classifying the one or more blocks in the clear interval as good or bad blocks by comparing the respective error measures to a third threshold; and estimating that the error condition in the data stream is cleared by comparing a count of the bad blocks in the clear interval threshold to a fourth threshold.

Preferably, the fourth threshold is set so that the error condition is cleared when none of the blocks in the clear interval have error measures greater than or equal to the third threshold. Additionally or alternatively, the third threshold is equal to the first threshold. Further additionally or alternatively, the clear interval is equal in length to the detection interval.

There is also provided, in accordance with a preferred embodiment of the present invention, an error detection unit for detecting an error rate of a data stream, which is divided into a sequence of data blocks, the unit including:

an error accumulator, which computes respective error measures for data blocks in the data stream, responsive to the error rate of the data stream;

a comparator, which compares the error measures of the blocks to a first threshold so as to identify bad blocks in the data stream; and decision logic, which receives the identification of the bad blocks from the comparator and estimates that an error condition exists responsive to a comparison of a count of the bad blocks in the data stream within a predetermined detection interval to a second threshold.

Preferably, the unit includes an integration counter, which counts the frames in the data stream and is programmed to issue a signal to the error accumulator indicative of the end of a block after the predetermined number of frames has passed. Most preferably, the predetermined number of the frames in the block and the first and second thresholds are programmable responsive to error condition criteria associated with the data stream.

Preferably, the data stream is conveyed over a SDH/SONET network element.

Additionally or alternatively, the unit includes a shift register, which receives and stores the identification output by the comparator for a number of the blocks in sequence corresponding to the predetermined detection interval, wherein periodically the identification of a new block in the sequence is input to the shift register, thereby defining a sliding detection window. Preferably, the decision logic estimates that the error condition exists if all of the blocks in the interval are identified in the shift register as bad blocks.

The present invention will be more fully understood from the following detailed description of the preferred embodiments thereof, taken together with the drawings in which:

DETAILED DESCRIPTION OF PREFERRED EMBODIMENTS

Figure 1:
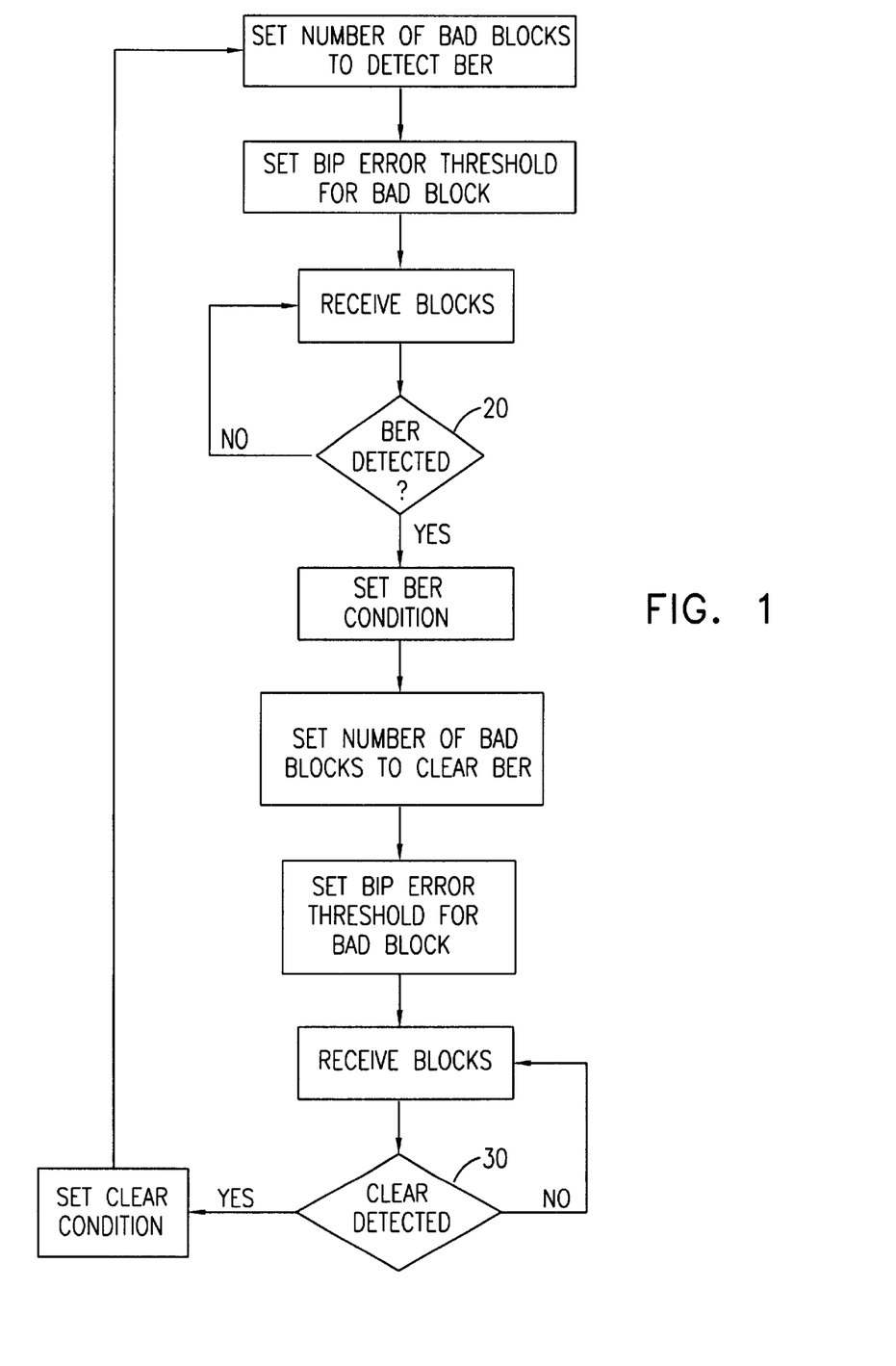
FIG. 1 is a flow chart that schematically illustrates a method for BER defect detection and clearing, in accordance with a preferred embodiment of the present invention.

FIG. 1 is a flow chart that schematically illustrates a method for detecting and clearing a defect condition in the bit error rate (BER) of a SDH/SONET data stream, in accordance with a preferred embodiment of the present invention. The method is based on determining the number of bit interleave parity (BIP) errors in the data stream.

For the sake of computational simplicity and speed, the errors are determined with respect to a BIP2 calculation, comprising a 2-bit result in which one bit is the XOR of all of the even bits in a given data frame, and the other bit is the XOR of all of the odd bits. As described in greater detail hereinbelow, the method compares the number of BIP2 errors, $n^d$, in each data block in the data stream to a first predetermined threshold, or BIP2 threshold, $N_t^d$, in order to classify the block as acceptable or errored (or "bad"). When the number of bad blocks, $m^d$, in a block sequence (or interval) of a given length, $M^d$, exceeds a second threshold, or block threshold, $M_t^d$, the BER condition is considered to exist. By way of introduction to the preferred implementation of the method shown in FIG. 1, the following description of the theoretical basis for this method is first presented.

For a given BER, the probability that the BIP2 even parity bit or the odd parity bit is errored is given by:

$$P_{BIP} = \sum_{i=1,3,\ldots,L} C_L^i (BER)^i (1-BER)^{L-i} \qquad (1)$$

wherein L is the number of bits in the checksum (L=416 for a standard SDH frame, for example), and $$C_L^i = \frac{L!}{i!(L-i)!} \qquad (2)$$

For the purposes of BER detection based on the BIP2 results, a block is defined as containing a certain number of data frames $K^d$. The number of BIP2 bits in a block is thus $N^d=2K^d$. The number of frames in the block is chosen so as to ensure that the BER condition will be detected or cleared within the requisite time limit. In the case of the ITU requirements described in the Background of the Invention, the time limit for use with VT1.5 is 40 ms. Since the duration of each frame is 0.5 ms, there are 4 BIP2 bits received per millisecond. In a preferred embodiment of the present invention described hereinbelow, a suitable block size for use with VT1.5 SDH/SONET lines has been found to be 24 frames, so that the duration of a block is 12 ms. To meet the detection time limit, therefore, the BER condition must be detected or cleared within three such blocks, allowing 36 ms for data collection and 4 ms additional for processing and communications. For a 12 ms block, there are thus $N^d=48$ BIP2 bits.

A block is considered to be errored if the number of BIP2 errors in the block $n^d$ is greater than the selected BIP2 threshold $N_t^d$. The probability of such an occurrence for a given value of $P_{BIP}$ (from equation 1) is given by:

$$P_{bad\text{-}block} = \sum_{n^d=N_t^d}^{N^d} C_{N^d}^{n^d} (P_{BIP})^{n^d} (1-P_{BIP})^{N^d-n^d} \qquad (3)$$

When $N^d$ is large, this definition can be simplified using the Poisson approximation, as is known in the art:

$$P_{bad\text{-}block} \approx e^{[-N^d P_{BIP}]} \sum_{n^d=N_t^d}^{N^d} \frac{(N^d P_{BIP})^{n^d}}{n^d!} \qquad (4)$$

The probability of detecting a BER defect state is defined to be the probability that within the $M^d$ blocks considered in a given interval, there are at least $M_t^d$ errored blocks, as given by:

$$P_{defect} = \sum_{m^d=M_t^d}^{M^d} C_{M^d}^{m^d} (P_{bad\text{-}block})^{m^d} (1-P_{bad\text{-}block})^{M^d-m^d} \qquad (5)$$

This formula is used to determine values of $P_{defect}$ for various choices of the parameters $N^d$, $N_t^d$, $M^d$ and $M_t^d$, so that the defect detection requirements of the applicable standard are met. Thus, for example, to meet the ITU requirements described in the Background of the Invention, when BER$\geq 10^{-3}$, $P_{defect}$ must be at least 0.99 (i.e., 99% probability of detection), whereas if BER$\leq 14^{-4}$, $P_{defect}$ must be no greater than $10^{-6}$. As noted above, $N^d$ and $M^d$ must also be chosen so as to satisfy the time limit for BER detection, 40 ms.

Table I illustrates values of $N_t^d$, $M^d$, and $M_t^d$ determined using equations (1) through (5) hereinabove for BER error detection in accordance with ITU requirements for a VT1.5 SDH/SONET line. Each entry in the table represents choices of $N_t^d$ that can, theoretically, satisfy the detection requirements for a given pair of values of $M^d$ and $M_t^d$. Two choices of $N_t^d$ are given for each entry, $N_{max}$ and $N_{min}$ (in the format $N_{min};N_{max}$), wherein $N_{max}$ is the largest choice of $N_t^d$ that will satisfy the 99% correct detection requirement, and $N_{min}$ is the smallest choice of $N_t^d$ that will satisfy the false alarm requirement. The actual BIP error threshold $N_t^d$ must be chosen to satisfy both of these requirements, so that entries for which $N_{min} > N_{max}$ cannot be used.

TABLE I

| | $M_t^d$ | | | | | | | |
|---|---|---|---|---|---|---|---|---|
| $M^d$ | 1 | 2 | 3 | 4 | 5 | 6 | 7 | 8 |
| 1 | 20;28 | | | | | | | |
| 2 | 14;16 | 10;10 | | | | | | |
| 3 | 12;10 | 8;8 | 6;6 | | | | | |
| 4 | 10;8 | 6;6 | 6;6 | 4;2 | | | | |
| 5 | 10;6 | 6;6 | 4;4 | 4;4 | 4;2 | | | |
| 6 | 8;6 | 6;6 | 4;4 | 4;4 | 4;2 | 2;0 | | |
| 7 | 8;6 | 6;4 | 4;4 | 4;4 | 4;2 | 2;2 | 2;0 | |
| 8 | 8;4 | 6;4 | 4;4 | 4;2 | 2;2 | 2;2 | 2;0 | 2;0 |

Equations (1) through (5) are also used to find values of the parameters $N^d$, $N_t^d$, $M^d$ and $M_t^d$ to be used in clearing the BER defect condition. The chosen parameters must lead to values of $P_{defect}$ that satisfy the applicable clear detection and false alarm rate requirements, i.e., such that for $BER \leq 10^{-4}$, $(1-P_{defect}) \geq 0.99$, and for $BER \geq 10^{-3}$, $(1-P_{defect}) \leq 10^{-6}$. Values of $N_t^d$ meeting these requirements are shown in Table II, in the same format as in Table I.

TABLE II

| | $M_t^d$ | | | | | | | |
|---|---|---|---|---|---|---|---|---|
| $M^d$ | 1 | 2 | 3 | 4 | 5 | 6 | 7 | 8 |
| 1 | 12;16 | | | | | | | |
| 2 | 8;8 | 6;4 | | | | | | |
| 3 | 6;6 | 4;4 | 4;0 | | | | | |
| 4 | 6;4 | 4;4 | 4;2 | 2;0 | | | | |
| 5 | 6;4 | 4;2 | 2;2 | 2;0 | 2;0 | | | |
| 6 | 6;4 | 4;2 | 2;2 | 2;2 | 2;0 | 2;0 | | |
| 7 | 4;2 | 4;2 | 2;2 | 2;2 | 2;0 | 2;0 | 2;0 | |
| 8 | 4;2 | 4;2 | 2;2 | 2;2 | 2;0 | 2;0 | 2;0 | 2;0 |

For the purposes of hardware simplicity in implementation, it is desirable that the parameters $N^d$, $M^d$ and $M_t^d$ have the same values for defect clearing as for defect detection. The values must in any case meet the defection and clearing time requirements of the applicable standard, in this case, 40 ms. It is also desirable that several blocks be examined before setting or clearing the error condition, i.e., that $M^d > 1$, in order to reduce the sensitivity of defect detection to transient burst errors. Preferably, for the purpose of defect detection, $M^d = M_t^d$; and for defect clearing $M_t^d = 1$. These conditions imply that the BER defect is detected when $m^d = M^d$, so that all of the blocks found within a sequence of $M^d$ consecutive blocks are errored; and the defect state is cleared only if $m_d = 0$, when there are no errored blocks found within a sequence of $M^d$ consecutive blocks that are considered.

Figure 5:
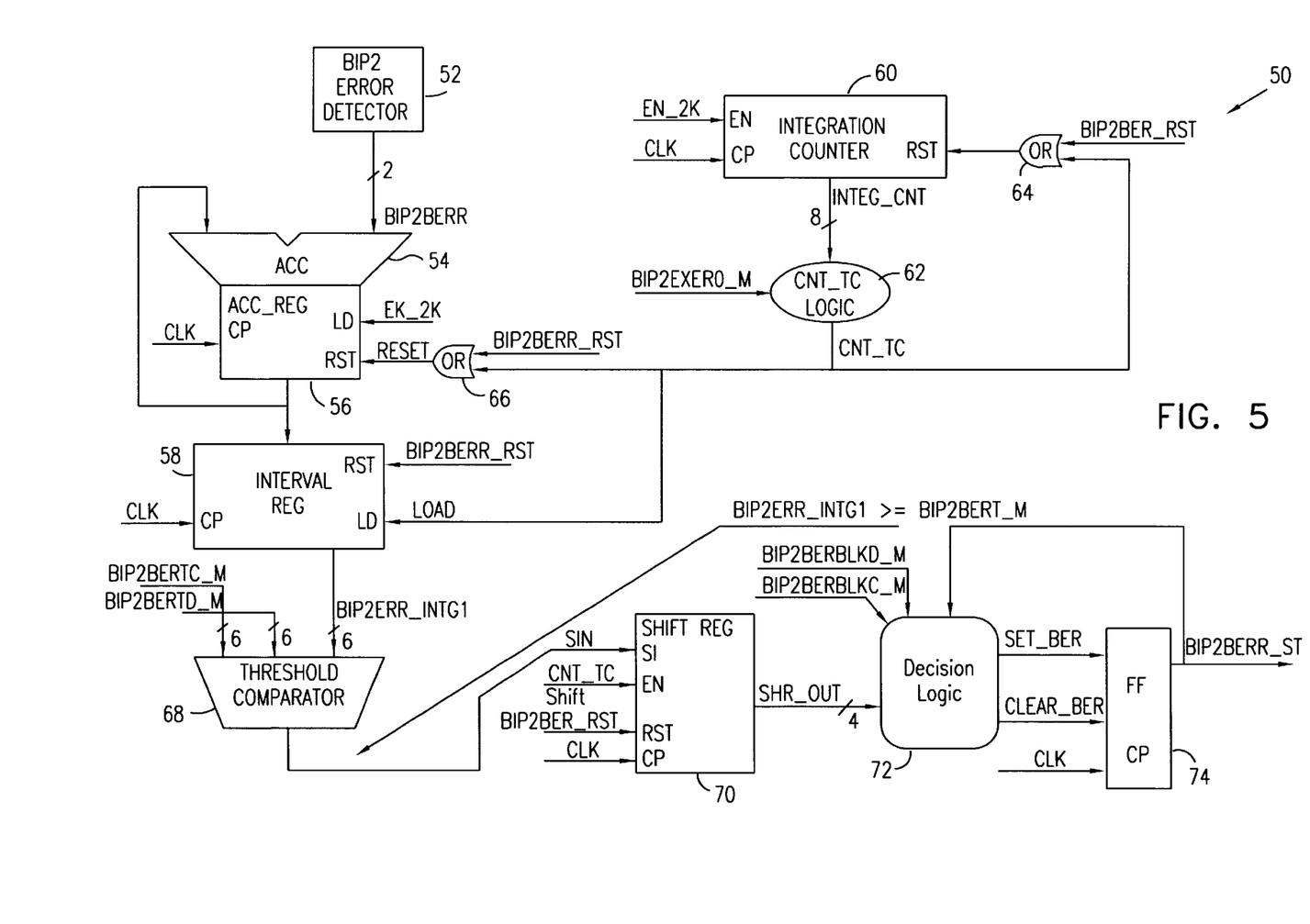
FIG. 5 is a block diagram that schematically illustrates an error detection unit for BER defect detection and clearing, in accordance with a preferred embodiment of the present invention.

With regard to the values of $N_t^d$ shown in Tables I and II, it is seen that these criteria are satisfied by choosing $M^d = 3$, with $M^{td} = 3$ for defect detection and $M_t^d = 0$ for clearing. In both cases, $N_t^d = 6$ out of a total $N^d = 48$ (12 ms blocks, as noted hereinabove). These choices of values lead to a simple, reliable hardware-based detection design, as shown in FIG. 5 and described hereinbelow. It will be appreciated, however, that other choices of the detection parameters are also feasible. Although the example shown in Tables I and II and described in detail herein relates specifically to a VT1.5 line in accordance with applicable ITU standards, those skilled in the art will be able to apply the principles and formulas presented hereinabove to determine suitable parameter values for use with data streams of other types, having different data rates and different BER defect criteria.

Returning now to FIG. 1, in order to detect a BER defect condition, an appropriate threshold number $M_t^d$ of errored blocks (or "bad" blocks) is selected, along with a BIP2 error threshold $N_t^d$ for determining a block to be bad. The bad block threshold and BIP2 error threshold are preferably chosen in accordance with the criteria described hereinabove, such that $M_t^d = 3$ and $N_t^d = 6$. A BER detection unit begins to receive successive blocks in a data stream and checks the blocks, at a BER detection step 20, in order to determine whether the defect detection thresholds are met. (A suitable BER detection unit for this purpose is shown in FIG. 5 and described in detail with reference thereto.) If and when the thresholds are met or exceeded, the detection unit sets a BER defect condition and outputs an indication, such as a BER alarm, that such a condition has been encountered.

Once the defect condition is set, the parameters of the detection unit are altered so as to be able to determine when the defect is cleared. Alteration of the parameters includes setting a new threshold number of bad blocks $M_t^d$ and, optionally, a new BIP2 error threshold $N_t^d$. In the present embodiment, $M_t^d = 0$ for defect clearing, while $N_t^d$ remains unchanged at 6. The detection unit receives data blocks and checks the blocks at a clear detection step 30. When the clear criteria have been met, the unit sets a BER clear condition and cancels the BER alarm. The unit then returns to its initial settings of the bad block and error thresholds and is again prepared to detect defect conditions.

Figure 2:
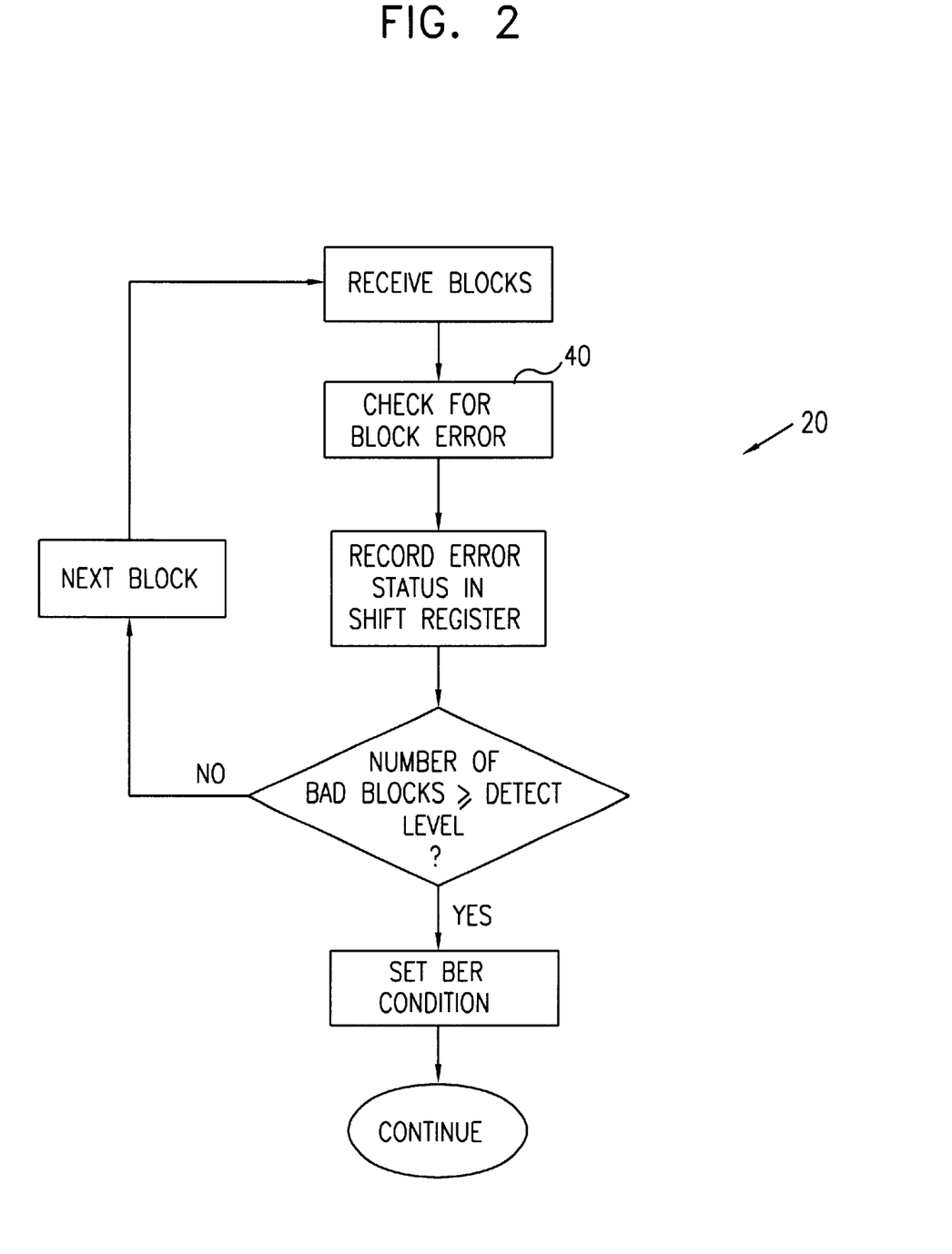
FIG. 2 is a flow chart that schematically illustrates details of the method for BER defect detection shown in FIG. 1, in accordance with a preferred embodiment of the present invention.

FIG. 2 is a flow chart that schematically illustrates details of BER detection step 20, in accordance with a preferred embodiment of the present invention. Blocks received by the BER detection unit are checked at a block error detection step 40 in order to determine whether the number of actual BIP2 errors $n_d$ in each of the blocks exceeds the error threshold $N_t^d$. The error result for each block is recorded in a memory, preferably in a shift register having a length equal to $M^d$. The results in the shift register show the number of bad blocks that occurred in a sliding time window having a duration equal to the cumulative duration of $M^d$ successive blocks. In the present embodiment, the shift register is three bits long, and the window duration is $3 \times 12$ ms=36 ms. If the number of bad blocks recorded in the shift register at any given time $m_d$ is equal to or greater than the selected threshold value $M_t^d$, the BER defect condition is set. In the present embodiment, wherein $M_t^d = 3$, the defect condition is set if all of the three entries in the shift register indicate that the corresponding blocks were bad blocks. Otherwise, the unit continues to receive and check new blocks.

Figure 3:
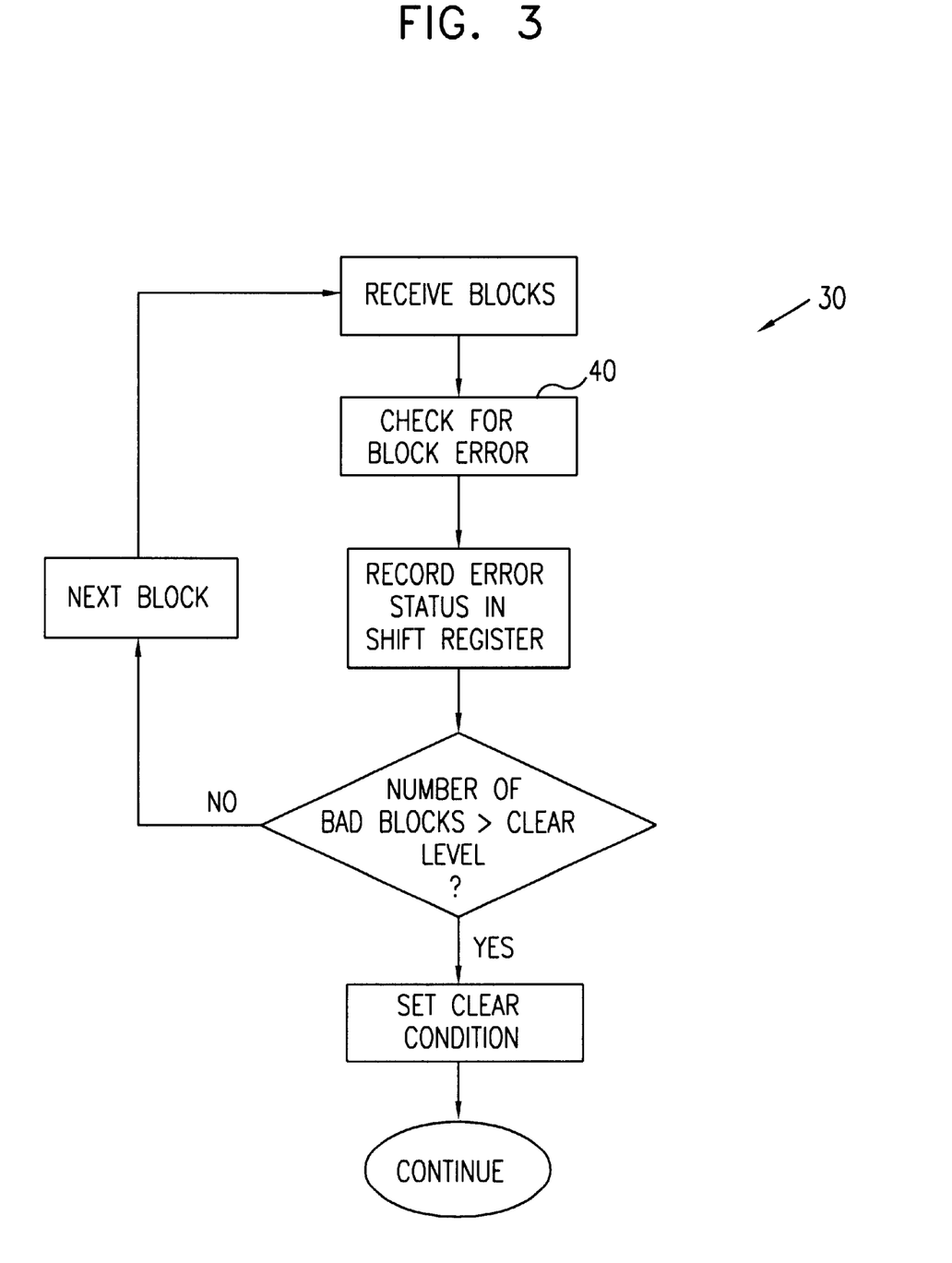
FIG. 3 is a flow chart that schematically illustrates details of the method for BER defect clearing shown in FIG. 1, in accordance with a preferred embodiment of the present invention.

FIG. 3 is a flow chart that schematically illustrates details of clear detection step 30, in accordance with a preferred embodiment of the present invention. Clear detection proceeds in a manner substantially similar to defect detection, as described with reference to FIG. 2, with block errors being detected at step 40 and the results entered in the shift register. In clear detection, however, the number of bad blocks recorded in the shift register is compared to a different threshold value $M_t^d$, and the defect condition is cleared only if $m_d$ is less than the threshold value. In the present embodiment, a clear condition is set only when $m^d = 0$, i.e., when no bad blocks are recorded in the shift register. Otherwise, the unit remains in the defect state and continues to receive and check new blocks to determine when a clear state occurs.

Figure 4:
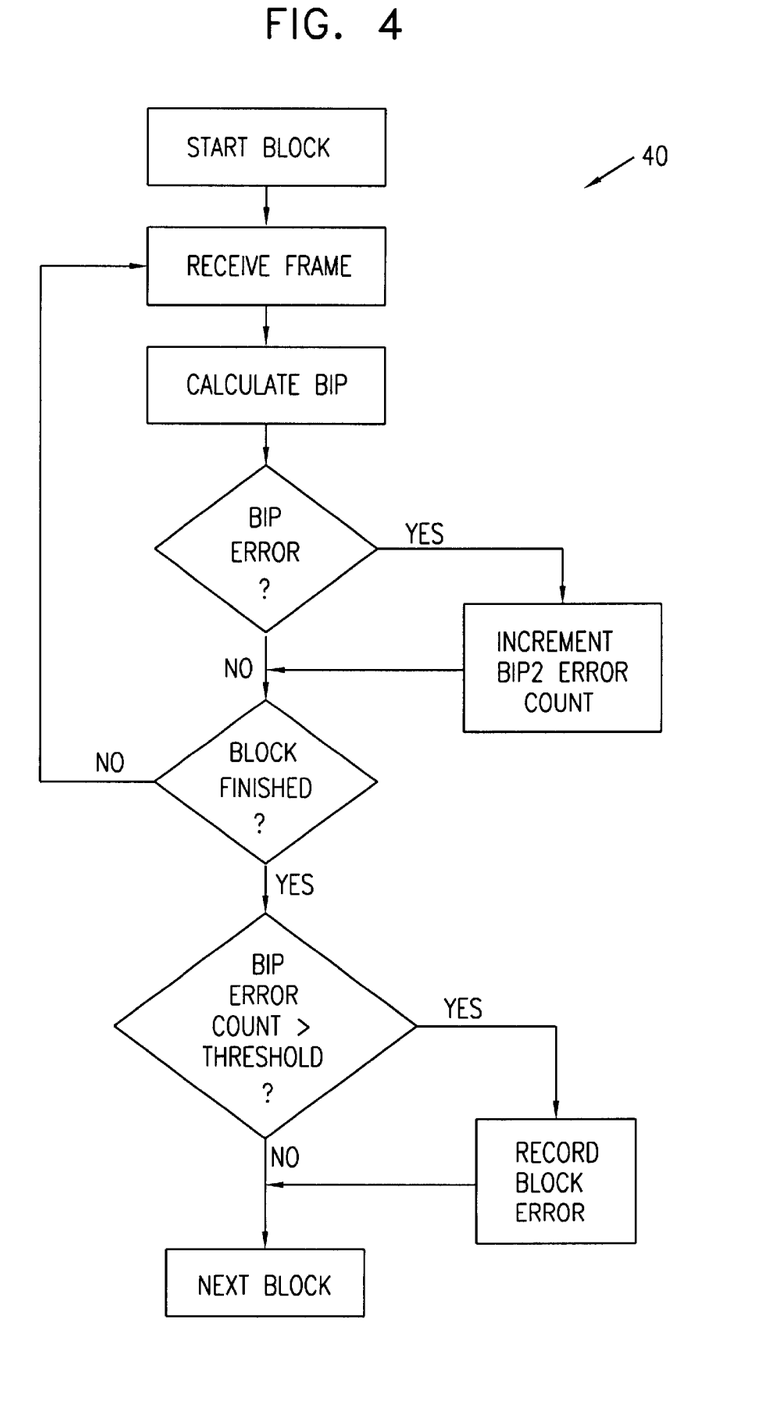
FIG. 4 is a flow chart that schematically illustrates details of a method for finding block errors, in accordance with a preferred embodiment of the present invention.

FIG. 4 is a flow chart that schematically illustrates details of block error detection step 40, in accordance with a preferred embodiment of the present invention. For each frame received in a given block, a BIP result, preferably a BIP2 result, is calculated. The calculated result is compared to a reference BIP value for the frame, which was determined before the frame was transmitted and was then sent with the subsequent frame in the data stream, as is known in the art. If there is a discrepancy between the calculated and reference BIP values for a given frame, that frame is counted as bad, and the count of bad frames in the block, $n^d$, is incremented. When the block is finished, $n^d$ is compared to the block error threshold $N_t^d$. If $n^d \geq N_t^d$, the block is recorded as a bad block.

FIG. 5 is a block diagram that schematically illustrates a BER detection unit 50 that performs the methods described hereinabove, in accordance with a preferred embodiment of the present invention. Unit 50 is preferably implemented as part of an ASIC device for use in a SDH/SONET communications controller, operating under the control of a system clock signal CLK at a preferred clock rate of 6.48 MHz. Various parameters of unit 50 are programmable, so that the unit can be adapted for use with different line types, such as VT1.5, VT2, VT3 and VT6.

A BIP2 error detector 52 calculates the BIP2 error for each frame and compares the result to a reference BIP2 value for the frame, so as to generate a BIP2BERR output, indicating number of BIP2 errors in the frame (0, 1 or 2). An accumulator 54 receives the BIP2 error output and, each time an erroneous frame is noted, increments a total error count for the present block that is maintained in a six-bit accumulator register 56. A frame clock EN_2K, preferably with a period of 0.5 ms, equal to the standard VT1.5 frame duration, controls the loading of each new BIP2BERR result into the accumulator.

An eight-bit integration counter 60 receives frame clock EN_2K and counts the number of frames received so as to determine when the present block is finished. Preferably, counter 60 counts 24 frames, over 12 ms, to mark off a single block, but the counter may also be programmed for other block sizes, such as 240 frames (120 ms) by means of a mode select input BIP2EXER0_M. The block size is selected, as described hereinabove, based on system specifications as to how rapidly a defect condition must be detected or cleared, and with what level of certainty. Thus, for a maximum BER of $10^{-3}$, the block size is set to 24 frames (12 ms detection time), whereas for a $10^{-4}$ maximum BER level, the block size is set to 240 frames (120 ms). Preferably, the same block size is used for both defect detection and defect clearing, unlike BER detection systems known in the art. Count logic 62 receives the count output INTEG_CNT from counter 60 and issues a CNT_TC signal at the end of the block, after the appropriate number of frames have passed (24 or 240 in the present embodiment).

The CNT_TC signal is received by an interval register 58, causing the register to load the accumulated error count from register 56. The CNT_TC signal is received at the next clock cycle by register 56 and by counter 60, via respective OR gates 66 and 64, so that the frame count and error count are initialized for the next block to arrive. A BIP2BERR_RST signal can also be applied to reset all elements of unit 50.

For each block, the accumulated number of frame errors BIP2ERR_INTG1 (or $n_d$, in accordance with the notation used hereinabove) is output by register 58 to a threshold comparator 68. The comparator compares this number to the appropriate threshold $N_t^d$ for detecting a BER defect (BIP2BERTD_M) or for clearing a defect (BIP2BERTC_M), depending on the state of unit 50. The values of BIP2BERTD_M and BIP2BERTC_M are programmable and, in the present embodiment, are both preferably set to the value 6. The output of comparator 68, SIN, is high when the number of frame errors is greater than or equal to the applicable threshold. This output is recorded in a shift register 70, preferably a three-bit shift register in the present embodiment.

Shift register 70 provides a four-bit output SHR_OUT to decision logic 72. The logic compares the number of high bits in the shift register to a bad block threshold value ($M_t^d$), which is set to either a defect detect threshold (BIP2BERBLKD_M) or to a defect clear threshold (BIP2BERBLKC_M), depending on the state of unit 50. The thresholds are programmable, wherein for the present embodiment, BIP2BERBLKD_M=3 and BIP2BERBLKC_M=1, as described hereinabove. Based on the comparison, when a change of state from clear to defective or defective to clear is mandated, logic 72 outputs a SET_BER or CLEAR_BER signal, respectively, to a flip-flop 74. The SET_BER and CLEAR_BER signals indicate the current BER status to the communications controller, which may take action accordingly. The flip-flop generates a RBIP2BER_ST change-of-state output, which causes the threshold values BIP2BERTx_M and BIP2BERBLKx_M to be reselected for the altered state of unit 50.

Although the preferred embodiment described hereinabove is based on a dedicated hardware device, it will be appreciated that the principles of the present invention may also be implemented in software on a general-purpose processor or using off-shelf hardware devices or in different combinations of dedicated devices, off-shelf components and software.

Furthermore, although preferred embodiments are described hereinabove with reference to SDH/SONET networks and standards, those skilled in the art will be able to apply the principles of the present invention in a straightforward manner to other types of synchronous data networks in which error rates need to be monitored. It will thus be appreciated that the preferred embodiments described above are cited by way of example, and the full scope of the invention is limited only by the claims.

What is claimed is:

1. A method for detecting an error rate of a data stream, comprising:

dividing the data stream into a sequence of blocks;

defining a detection interval comprising a predetermined number of blocks in the sequence;

computing for one or more of the blocks in the detection interval respective error measures responsive to the error rate of the data stream;

classifying the one or more blocks in the detection interval as good or bad blocks by comparing the respective error measures to a first threshold; and estimating that an error condition exists in the data stream by comparing a count of the bad blocks in the interval to a second threshold.

2. A method according to claim 1, wherein computing the error measures comprises computing bit interleave parity (BIP) values and comparing the computed BIP values to reference BIP values transmitted with the data stream to find BIP errors.

3. A method according to claim 2, wherein each of the blocks comprises a predetermined number of data frames, and wherein computing and comparing the BIP values comprises computing BIP values with respect to the frames.

4. A method according to claim 3, wherein the BIP values comprise BIP2 values.

5. A method according to claim 3, wherein computing the BIP values comprises counting how many BIP errors occur in a given one of the blocks.

6. A method according to claim 5, wherein the first threshold defines a number of BIP errors that may occur in the block, such that classifying the one or more blocks comprises counting a block as bad if the number of BIP errors in the block is greater than or equal to the defined number.

7. A method according to claim 6, wherein estimating that the error condition exists comprises estimating that the error rate of the data stream exceeds a permitted bit error rate (BER) and setting a BER output responsive to the estimation.

8. A method according to claim 7, wherein the data stream is conveyed over a SDH/SONET network element.

9. A method according to claim 1, wherein estimating that the error condition exists comprises determining that there is a detection probability greater than a minimum detection probability that the error rate of the data stream exceeds a predetermined error level.

10. A method according to claim 9, wherein estimating that the error condition exists comprises determining that there is a false alarm probability less than a maximum false alarm probability that the error rate of the data stream is less than a predetermined clear level.

11. A method according to claim 10, wherein the first and second thresholds are chosen responsive to the minimum detection probability and maximum false alarm probability.

12. A method according to claim 11, wherein dividing the data stream into blocks comprises selecting a block size responsive to the minimum detection probability and maximum false alarm probability, and wherein the first and second thresholds are chosen responsive to the block size.

13. A method according to claim 1, wherein defining the detection interval comprises defining an interval that is no greater than a maximum detection time permitted for estimating that the error condition exists when the error rate of the data stream exceeds a predetermined error level.

14. A method according to claim 1, wherein defining the detection interval comprises defining a sliding window, such that periodically a new block in the sequence is added to the interval, and the earliest block in the sequence that is contained in the interval is removed therefrom.

15. A method according to claim 14, wherein estimating that the error condition exists comprises estimating that an error condition exists if all of the blocks in the interval have error measures greater than or equal to the first threshold.

16. A method according to claim 1, and comprising:
defining a clear interval comprising a predetermined number of blocks in the sequence;
computing the respective error measures for the blocks in the clear interval;
classifying the one or more blocks in the clear interval as good or bad blocks by comparing the respective error measures to a third threshold; and
estimating that the error condition in the data stream is cleared by comparing a count of the bad blocks in the clear interval threshold to a fourth threshold.

17. A method according to claim 16, wherein the fourth threshold is set so that the error condition is cleared when none of the blocks in the clear interval have error measures greater than or equal to the third threshold.

18. A method according to claim 16, wherein the third threshold is equal to the first threshold.

19. A method according to claim 16, wherein the clear interval is equal in length to the detection interval.

20. An error detection unit for detecting an error rate of a data stream, which is divided into a sequence of data blocks, the unit comprising:
an error accumulator, which computes respective error measures for data blocks in the data stream, responsive to the error rate of the data stream;
a comparator, which compares the error measures of the blocks to a first threshold so as to identify bad blocks in the data stream; and
decision logic, which receives the identification of the bad blocks from the comparator and estimates that an error condition exists responsive to a comparison of a count of the bad blocks in the data stream within a predetermined detection interval to a second threshold.

21. A unit according to claim 20, wherein the error accumulator comprises an error detector, which computes bit interleave parity (BIP) values and compares the computed BIP values to reference BIP values transmitted with the data stream to find BIP errors, which are counted by the error accumulator.

22. A unit according to claim 21, wherein the data stream comprises data frames, and wherein each of the blocks comprises a predetermined number of data frames, and wherein the error detector computes the BIP values and detects the BIP errors with respect to the frames, such that the error measures of the blocks correspond to the respective numbers of BIP errors occurring in the blocks.

23. A unit according to claim 22, wherein the BIP values comprise BIP2 values.

24. A unit according to claim 22, and comprising an integration counter, which counts the frames in the data stream and is programmed to issue a signal to the error accumulator indicative of the end of a block after the predetermined number of frames has passed.

25. A unit according to claim 24, wherein the predetermined number of the frames in the block and the first and second thresholds are programmable responsive to error condition criteria associated with the data stream.

26. A unit according to claim 22, wherein the decision logic estimates that the error rate of the data stream exceeds a permitted bit error rate (BER) and sets a BER output, responsive to the count of the bad blocks in the predetermined interval.

27. A unit according to claim 26, wherein the data stream is conveyed over a SDH/SONET network element.

28. A unit according to claim 20, and comprising a shift register, which receives and stores the identification output by the comparator for a number of the blocks in sequence corresponding to the predetermined detection interval, wherein periodically the identification of a new block in the sequence is input to the shift register, thereby defining a sliding detection window.

29. A unit according to claim 28, wherein the decision logic estimates that the error condition exists if all of the blocks in the interval are identified in the shift register as bad blocks.

30. A unit according to claim 20, wherein after estimating that the error condition exists, the decision logic determines that the error condition in the data stream is cleared responsive to a comparison of a count of the bad blocks within a predetermined clear interval in the data stream to a fourth threshold, wherein the bad blocks are identified by the comparator responsive to a third threshold.

31. A unit according to claim 30, wherein the third threshold is equal to the first threshold, and wherein the clear interval is equal in duration to the detection interval.

* * * * *